(12) United States Patent
Fu et al.

(10) Patent No.: US 7,130,367 B1
(45) Date of Patent: Oct. 31, 2006

(54) DIGITAL DELAY LOCK LOOP FOR SETUP AND HOLD TIME ENHANCEMENT

(75) Inventors: Wei Fu, San Diego, CA (US); Joseph J. Balardeta, Del Mar, CA (US); James Corona, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 625 days.

(21) Appl. No.: 10/120,599

(22) Filed: Apr. 9, 2002

(51) Int. Cl.
*H03D 3/24* (2006.01)
(52) U.S. Cl. .............. 375/376; 375/371; 375/377; 714/770
(58) Field of Classification Search ........ 375/376, 375/377, 371; 714/770
See application file for complete search history.

(56) References Cited

U.S. PATENT DOCUMENTS 5,987,085 A * 11/1999 Anderson ............... 375/374
6,370,200 B1 * 4/2002 Takahashi ............... 375/257
6,426,984 B1 * 7/2002 Perino et al. ............ 375/356
2003/0006877 A1 * 1/2003 Anand .................... 338/320
2003/0046618 A1 * 3/2003 Collins ................... 714/700

OTHER PUBLICATIONS

Lee, Thomas H., et al., "A 2.5 V CMOS Delay-Locked Loop for an 18 Mbit, 500 Megabyte/s DRAM," IEEE J. Solid-State Circuits, vol. 29, No. 12, Dec. 1994.

* cited by examiner

*Primary Examiner*—Stephen Chin
*Assistant Examiner*—Nasrin Hoque
(74) *Attorney, Agent, or Firm*—INCAPLAW; Terrance A. Meador

(57) ABSTRACT

A digital delay lock loop (DLL) circuit for receiving parallel data and clock signals, deserializing the high speed parallel data to low speed data, and for improving setup and hold times. A DLL circuit for an N-bit datapath, includes a clock DLL configured to provide a clock signal pulse within an eye opening of each of N data signals. The DLL circuit further includes N data DLLs, each being configured to adjust a delay of a data signal to substantially center the eye opening of the data signal on the clock signal pulse.

8 Claims, 3 Drawing Sheets

DIGITAL DELAY LOCK LOOP FOR SETUP AND HOLD TIME ENHANCEMENT

BACKGROUND OF THE INVENTION

The present invention generally relates to digital communications, and more particularly to a delay lock loop (DLL) circuit for improving setup and hold times for a parallel data communication system.

Digital communications promises faster, flexible, and more reliable speeds than conventional analog communications. Accordingly, various time measurements become critical. For instance, in a digital communication system, setup time represents the length of time that a pulse is held in order to produce a state change. Hold time represents the length of time a signal is maintained at a certain input after changing state at another input. Low setup and hold times are important, especially for high speed parallel data.

The setup and hold time windows on high speed data lines can be degraded by clock driver and data driver skew, duty cycle distortion of data drivers, clock and data jitter, and power supply noise. Several schemes that have been developed to improve setup and hold time, but which actually increase jitter, or dissipate too much power as noise

DETAILED DESCRIPTION OF THE PREFERRED EMBODIMENTS

Figure 1:
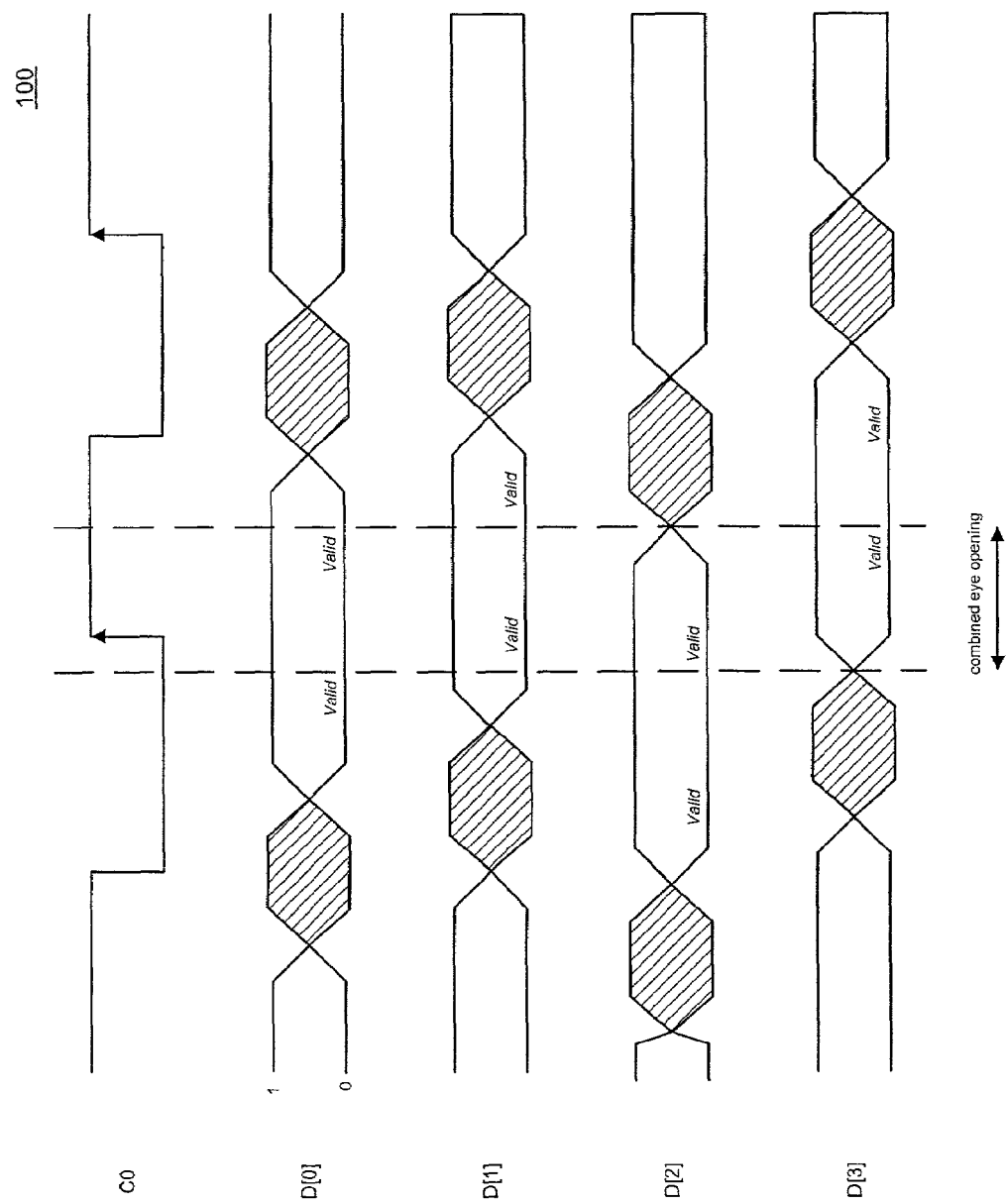
FIG. 1 depicts a graph showing combined high-speed parallel data signals and a clock signal.

This invention provides a DLL circuit for enhancing setup time and hold time for high speed data lines. The invention, embodied as a circuit, includes multiple DLL circuits for an N-bit datapath, comprising a clock DLL configured to provide a clock signal pulse within an eye opening of each of N parallel data signals, and N data DLLs each being configured to center the eye opening of its associated data signal on the clock signal pulse. The clock signal pulse can be a clock rising edge. Or, the clock signal pulse can be a clock falling edge. Each data DLL is configured to adjust a delay of a data signal to substantially center the eye opening of the data signal on the clock signal pulse.

In accordance with another example of the invention, a method of improving set-up and hold time for parallel data and clock signals in a delay lock loop (DLL) circuit, includes adjusting a delay of a clock signal until a clock signal pulse is repeatedly locked within an eye opening of a plurality of at least partially parallel data signals. The method further includes adjusting a delay of each one of the plurality of parallel data signals to align the center of the eye opening of each one of the plurality of parallel data signals to the clock signal pulse.

The DLLs are digital DLLs, which take up less area on a chip, dissipate less power, thus meeting low jitter requirements. Most important, digital DLLs can be integrated within the VLSI floor or chip area. The DLL in accordance with this invention receives high speed parallel data and clock signals, and deserializes the data to low speed data to improve the output setup and hold time. The DLL circuit according to the invention includes two loops to allow for poor input setup and hold time on the incoming high speed data with respect to the clock. The DLL circuit includes a clock loop and a data loop. The data loop is further comprised of N data loops representing an N-bit datapath.

In accordance with one embodiment of the invention, the clock DLL includes a clock signal input, a clock variable delay unit (VDU) having a first input coupled to the clock signal input, and having a delayed clock signal output. The clock DLL also includes a data VDU having an input coupled to the clock signal input. The clock DLL further includes a phase detector having a first input coupled to the delayed clock signal output, and having a second input coupled to an output of the data VDU, and a filter/control circuit having an input coupled to an output of the phase detector, and having a first output connected to a second input of the clock VDU. The clock DLL further includes a lock circuit having an input coupled to a second output of the filter/control circuit, and a lock detection signal output.

In accordance with the invention, the data DLL includes a clock signal input, a data signal input, and a clock VDU having an input coupled to the clock signal input, and having a delayed clock signal output. The data DLL further includes a data VDU having a first input coupled to the data signal input, and having a delayed data signal output. The data DLL further includes a phase detector having a first input coupled to the delayed clock signal output, and having a second input coupled to the delayed data signal output. A filter/control circuit is provided having an input coupled to an output of the phase detector, and having an output connected to a second input of the data VDU. The data DLL also includes a demultiplexer having a first input coupled to the delayed clock signal output and a second input coupled to the delayed data signal output. The demultiplexer further includes demultiplexed clock and data outputs.

Figure 2:
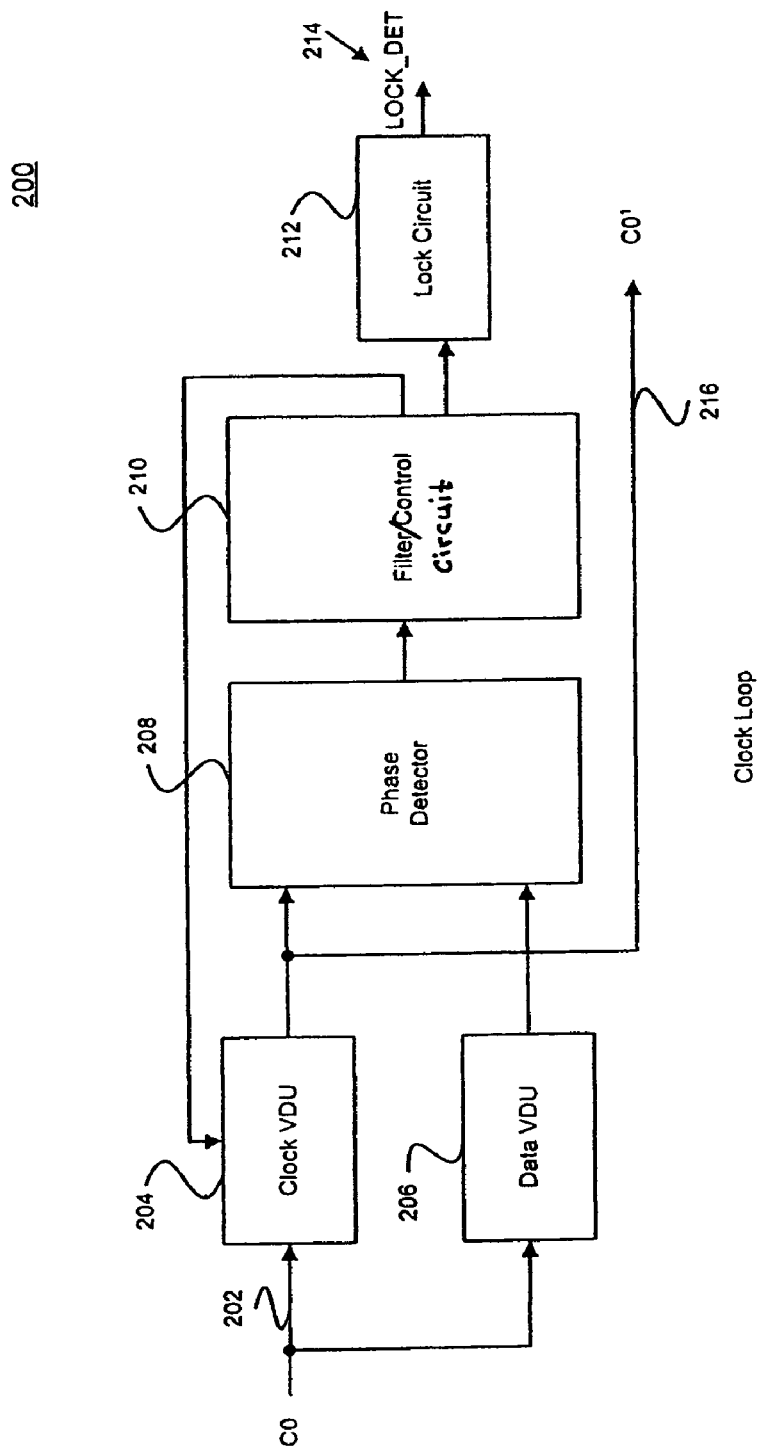
FIG. 2 is a simplified circuit diagram of a clock delay lock loop in accordance with an embodiment of the invention.
Figure 3:
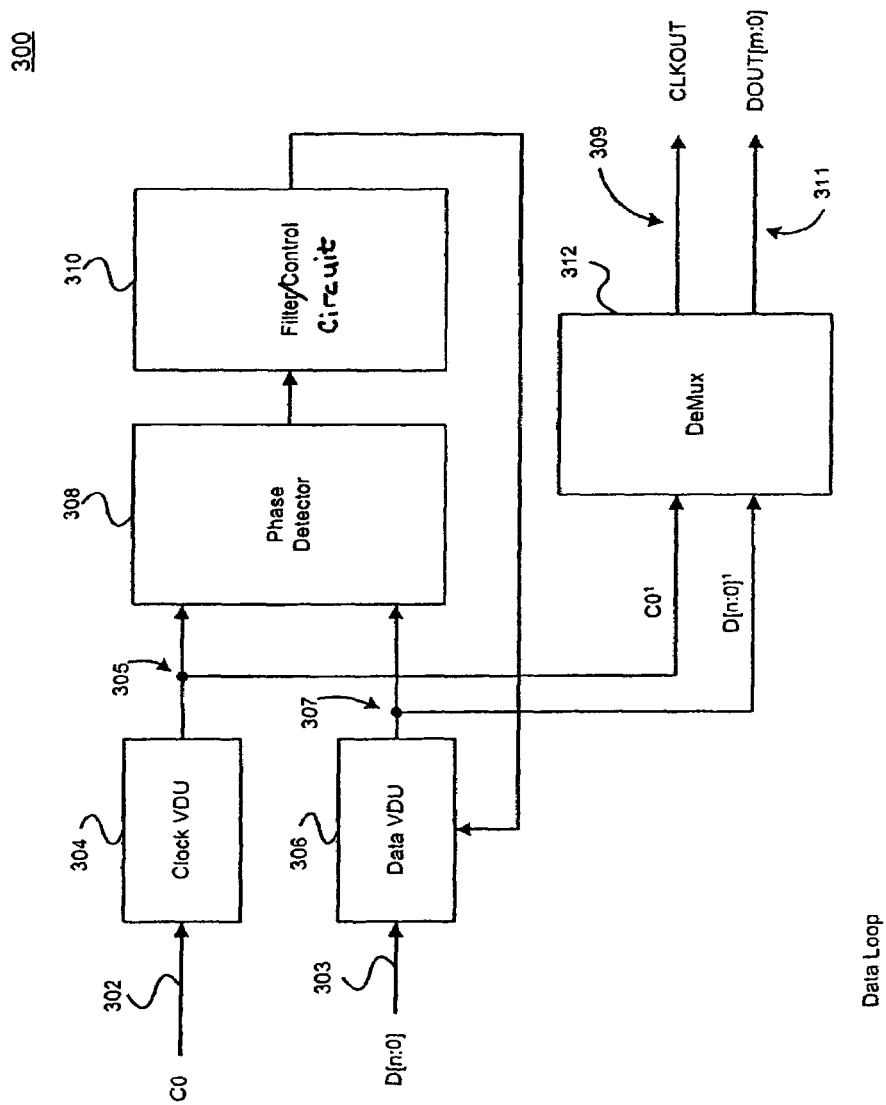
FIG. 3 is a simplified circuit diagram of a data delay lock loop in accordance with an embodiment of the invention.

FIGS. 1 through 3 illustrate an exemplary embodiment of a circuit and method according to the invention. FIG. 1 depicts a graph 100 showing a clock signal C0 and parallel data signals D[0], D[1], D[2], and D[3]. Each data signal includes an eye opening, represented as a non-shaded signal, and a null portion in between transitions, represented as a smaller, shaded opening. The change from a null portion to an eye opening, and vice versa, can represent a state change. The parallel data signals may be partially-coincident, meaning that they are partially time shifted from each other due to noise, transmission line loss, etc. The clock signal C0 includes periodic pulses, i.e. a clock signal rising edge or falling edge. The clock signal rising edge can represent the clock signal pulse. Alternatively, the clock signal falling edge can be the clock signal pulse.

According to the invention, two DLLs are used to eliminate time-shifts, jitter, and enhance setup and hold times. With reference to FIGS. 1 and 2, a clock DLL 200 and its operation is shown. The clock DLL 200 includes a clock signal input 202, a clock variable delay unit (VDU) 204, a data VDU 206, a phase detector 208, a filter/control circuit 210, and a lock circuit 212. The clock DLL 200 also includes a lock detection signal output 214 and a delayed clock signal output 216. The clock VDU 204 has a first input coupled to the clock signal input 202, and an output coupled to the delayed clock signal output. The data VDU 206 has an input coupled to the clock signal input 202. The phase detector 208 has a first input coupled to the clock VDU output 216, and a second input coupled to an output of the data VDU 206. The filter/control circuit 210 has an input coupled to an output of the phase detector 208, and a first output connected to a second input of the clock VDU 204. The lock circuit 212 has an input coupled to a second output of the filter/control circuit 210, and an output coupled to the lock detection signal output 214.

In operation, the clock VDU 204 receives and delays a clock signal on the clock signal input 202. The data VDU 206 also receives and delays the clock signal. The phase detector 208 is configured to receive both delayed clock signals, and measure a phase difference between them. The filter/control circuit 210 filters the output of the phase detector 208 and adjusts a delay of the clock VDU 204 to align a clock signal pulse, i.e. the clock signal rising edge, to make the clock VDU 204 delay equal to the data VDU delay, as indicated in FIG. 1. It should be understood that a clock signal falling edge may also be used as the clock signal pulse.

The parallel data signals are each received at one of N data DLLs, described below. The lock circuit 212 generates the lock signal on the lock detection signal output 214 when the clock signal is aligned. The lock circuit 212 monitors the filter/control circuit 210 outputs to determine if the two clock signals, i.e. from the clock VDU 204 and the data VDU 206, are aligned. Once aligned, the lock signal goes HIGH, and the second loop (data DLL) is enabled. According to one exemplary embodiment, the lock circuit 212 is equipped with hysteresis to ensure metastability.

With reference to FIGS. 1 and 3, a preferred embodiment of one of N data DLLs 300 will be described. The data DLL 300 includes a clock signal input 302 and a data signal input 303. The loop 300 further includes a clock VDU 304 having an input coupled to the clock signal input 302, and having a delayed clock signal output 305. A data VDU 306 is provided having a first input coupled to the data signal input 303, and a delayed data signal output 307. The data DLL 300 further includes a phase detector 308 having a first input coupled to the delayed clock signal output 305, and a second input coupled to the delayed data signal output 307. The data loop 300 also includes a filter/control circuit 310 having an input coupled to an output of the phase detector, and an output connected to a second input of the data VDU 306. The data DLL 300 further includes a demultiplexer 312 having a first input coupled to the delayed clock signal output 305 and a second input coupled to the delayed data signal output 307, and having demultiplexed clock and data outputs 309 and 311, respectively.

The data DLL 300 is activated once the lock signal is achieved by the clock DLL 200. In operation, the clock VDU 304 receives and delays a clock signal on clock signal input 302. The data VDU 305 receives and delays one of N at least partially-coincident parallel data signals on data signal input 305. The phase detector 308 measures a phase difference between the delayed clock signal and the delayed data signal. The filter/control circuit 310 filters the output of the phase detector 308 and adjusts the delay of the data VDU 306 to align the center of the data signal with the adjusted clock signal, so the rising edge of the clock signal occurs at the center of the data eye opening. The demultiplexer 312 outputs the aligned data signal and adjusted clock signal. Each of the N data DLLs 300 will perform the same operation in parallel, resulting in data bits being output to a deserializer with large setup and hold time windows.

In each of the clock DLL 200 and data DLL 300, a nonlinear digital filter can be used in the filter/control circuit 210, 310 to achieve low jitter performance. The nonlinearity of the filter is applied to cancel the nonlinearity of the phase detectors 208 and 308. Thus, the result is low jitter performance when the loops are in lock mode.

While various embodiments of the invention are described above, it should be understood that they are presented for example only, and not as limitations to the following claims. Accordingly, the scope and breadth of the present invention should only be defined in accordance with the following claims and their equivalents.

What is claimed is:

1. A delay lock loop (DLL) circuit for an N-bit datapath, comprising:
   a clock loop, including a clock variable delay unit (VDU) for receiving and delaying a clock signal, a data VDU for receiving and delaying the clock signal, a phase detector configured to measure a phase difference between the delayed clock signals, a filter/control circuit for adjusting the delay of the clock VDU to align the clock signal to within an eye opening of each one of a plurality of at least partially parallel data signals, and a lock circuit for generating a lock signal when the clock signal is aligned; and
   N data loops, each data loop being enabled by the lock signal and including a clock VDU for receiving and delaying the clock signal, a data VDU for receiving and delaying one of N at least partially-coincident parallel data signals being time-shifted from each other, a phase detector configured to measure a phase difference between the delayed clock signal and the delayed data signal, the filter/control circuit for adjusting the delay of the data VDU to align the data signal with the adjusted delayed clock signal, and a demultiplexer for outputting the aligned data signal and adjusted delayed clock signal.

2. The DLL circuit of claim 1, wherein each filter/control circuit includes a nonlinear digital filter.

3. The DLL circuit of claim 1, wherein the N data loops are configured to remove the time-shift from the N parallel data signals.

4. The DLL circuit of claim 3, wherein the N data loops are configured to decrease a speed of each of the N parallel data signals.

5. A delay lock loop (DLL) circuit for an N-bit datapath, comprising:
   a clock loop, comprising:
      a clock signal input;
      a clock variable delay unit (VDU) having a first input coupled to the clock signal input, and a delayed clock signal output;
      a data VDU having an input coupled to the clock signal input;
      a phase detector having a first input coupled to the delayed clock signal output, and a second input coupled to an output of the data VDU;
      a filter/control circuit having an input coupled to an output of the phase detector, and a first output connected to a second input of the clock VDU;
      a lock circuit having an input coupled to a second output of the filter/control circuit, and a lock detection signal output; and
   N data loops, each data loop comprising:
      a clock signal input;
      a data signal input;
      a clock VDU having an input coupled to the clock signal input, and a delayed clock signal output;
      a data VDU having a first input coupled to the data signal input, and a delayed data signal output;

a phase detector having a first input coupled to the delayed clock signal output, and a second input coupled to the delayed data signal output;

a filter/control circuit having an input coupled to an output of the phase detector, and an output connected to a second input of the data VDU; and a demultiplexer having a first input coupled to the delayed clock signal output and a second input coupled to the delayed data signal output, and having demultiplexed clock and data outputs.

6. The DLL circuit of claim 5, wherein each filter/control circuit includes a nonlinear digital filter.

7. A digital delay lock loop (DLL) circuit for an N-bit datapath, comprising:

a clock DLL configured to provide a clock signal pulse within an eye opening of each of N data signals; and N data DLLs, each being configured to adjust a delay of one of the N data signals to substantially center the eye opening of the data signal on the clock signal pulse, wherein the clock DLL comprises:

a clock signal input;

a clock variable delay unit (VDU) having a first input coupled to the clock signal input, and a delayed clock signal output:

a data VDU having an input coupled to the clock signal input;

a phase detector having a first input coupled to the delayed clock signal output, and a second input coupled to an output of the data VDU;

a filter/control circuit having an input coupled to an output of the phase detector, and a first output connected to a second input of the clock VDU;

a lock circuit having an input coupled to a second output of the filter/control circuit, and a lock detection signal output; and, wherein each data DLL comprises:

a clock signal input;

a data signal input;

a clock VDU having an input coupled to the clock signal input, and a delayed clock signal output;

a data VDU having a first input coupled to the data signal input, and a delayed data signal output;

a phase detector having a first input coupled to the delayed clock signal output, and a second input coupled to the delayed data signal output;

a filter/control circuit having an input coupled to an output of the phase detector, and an output connected to a second input of the data VDU; and a demultiplexer having a first input coupled to the delayed clock signal output and a second input coupled to the delayed data signal output, and having demultiplexed clock and data outputs.

8. The circuit of claim 7, wherein the filter/control circuit includes a nonlinear digital filter.

* * * * *